(12) United States Patent
Sakamoto et al.

(10) Patent No.: US 8,896,119 B2
(45) Date of Patent: Nov. 25, 2014

(54) BONDING MATERIAL FOR SEMICONDUCTOR DEVICES

(75) Inventors: Yoshitsugu Sakamoto, Kariya (JP); Hiroyuki Yamada, Kariya (JP); Yoshie Yamanaka, Tokyo (JP); Tsukasa Ohnishi, Tokyo (JP); Shunsaku Yoshikawa, Tokyo (JP); Kenzo Tadokoro, Tokyo (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 0 days.

(21) Appl. No.: 13/261,584

(22) PCT Filed: Aug. 3, 2011

(86) PCT No.: PCT/JP2011/067770
§ 371 (c)(1),
(2), (4) Date: Feb. 5, 2013

(87) PCT Pub. No.: WO2012/018046
PCT Pub. Date: Feb. 9, 2012

(65) Prior Publication Data
US 2013/0134591 A1  May 30, 2013

(30) Foreign Application Priority Data

Aug. 5, 2010 (JP) ................................. 2010-176456

(51) Int. Cl.
| | | |
|---|---|---|
| H01L 23/48 | (2006.01) |
| H01L 23/00 | (2006.01) |
| C22C 1/08 | (2006.01) |
| B23K 35/02 | (2006.01) |
| B23K 35/30 | (2006.01) |
| H01L 23/373 | (2006.01) |
| C22C 9/02 | (2006.01) |
| C22C 13/00 | (2006.01) |
| B23K 35/26 | (2006.01) |
| H05K 3/34 | (2006.01) |

(52) U.S. Cl.
CPC ....... *B23K 35/262* (2013.01); *H01L 2924/0665* (2013.01); *H01L 2224/2929* (2013.01); *H01L 24/07* (2013.01); *H01L 24/48* (2013.01); *H01L 2224/73265* (2013.01); *H01L 2224/32225* (2013.01); *H01L 2924/01327* (2013.01);

(Continued)

(58) Field of Classification Search
CPC .. B23K 35/025; B23K 35/262; B23K 35/302; C22C 1/08; C22C 13/00; C22C 9/02; H01L 24/07; H01L 24/29; H01L 24/32; H01L 24/83
USPC ......... 257/746, 421, 741, 747, 748, 772, 762, 257/766, 779, E23.023
See application file for complete search history.

(56) References Cited

U.S. PATENT DOCUMENTS

2006/0061974 A1* 3/2006 Soga et al. .................... 361/743

FOREIGN PATENT DOCUMENTS

| JP | 2002 254194 | 9/2002 |
| JP | 2002 301588 | 10/2002 |

(Continued)

*Primary Examiner* — Jose R Diaz
(74) *Attorney, Agent, or Firm* — Michael Tobias

(57) ABSTRACT

A semiconductor device is provided which has internal bonds which do not melt at the time of mounting on a substrate. A bonding material is used for internal bonding of the semiconductor device. The bonding material is obtained by filling the pores of a porous metal body having a mesh-like structure and covering the surface thereof with Sn or an Sn-based solder alloy.

11 Claims, 2 Drawing Sheets

(52) U.S. Cl.
CPC ............... *H01L 2924/10253* (2013.01); *H01L 2224/83801* (2013.01); *H05K 3/3463* (2013.01); *H01L 2924/0105* (2013.01); *H01L 2924/01028* (2013.01); *H01L 2224/29299* (2013.01); C22C 1/08 (2013.01); *H01L 2924/0103* (2013.01); *H01L 2924/01322* (2013.01); *H01L 2924/01021* (2013.01); *H01L 2924/01078* (2013.01); *H01L 24/73* (2013.01); *H01L 2224/45144* (2013.01); *H01L 2224/29* (2013.01); *H01L 2924/01082* (2013.01); *H01L 2924/01029* (2013.01); B23K 35/025 (2013.01); *H01L 2224/29101* (2013.01); H01L 24/83 (2013.01); *H01L 2224/48472* (2013.01); H01L 24/32 (2013.01); *H01L 2224/83444* (2013.01); *H01L 2224/29198* (2013.01); *H01L 2224/48227* (2013.01); *H01L 2924/01033* (2013.01); B23K 35/302 (2013.01); *H01L 2224/83065* (2013.01); *H01L 2924/01051* (2013.01); *H01L 2924/01005* (2013.01); *H01L 2924/01047* (2013.01); *H01L 2224/32014* (2013.01); *H01L 24/45* (2013.01); H01L 23/3735 (2013.01); C22C 9/02 (2013.01); *H01L 2924/014* (2013.01); C22C 13/00 (2013.01); *H01L 2224/2919* (2013.01); *H01L 2924/01079* (2013.01); *H01L 2224/8384* (2013.01); *B23K 2201/40* (2013.01); *H01L 2924/0132* (2013.01); *H01L 2924/01006* (2013.01); *H01L 2224/8309* (2013.01); *H01L 2924/01014* (2013.01); *B22F 2998/00* (2013.01); *H01L 2224/83455* (2013.01); H01L 24/29 (2013.01); *H01L 2924/01004* (2013.01); *H05K 2201/0116* (2013.01); *H01L 2224/48091* (2013.01); *H01L 2924/00013* (2013.01)
USPC ..... 257/746; 257/741; 257/772; 257/E23.023

(56) References Cited

FOREIGN PATENT DOCUMENTS

| | | |
|---|---|---|
| JP | 2004 298962 | 10/2004 |
| JP | 2008 200728 | 9/2008 |
| JP | 2010 047787 | 3/2010 |
| WO | 2006 075459 | 7/2006 |

\* cited by examiner

BONDING MATERIAL FOR SEMICONDUCTOR DEVICES

This is a 371 national stage application of PCT/JP2011/067770 filed Aug. 3, 2011, claiming priority to Japanese Patent Application No. 2010-176456 filed Aug. 5, 2010.

TECHNICAL FIELD

This invention relates to a solder bonding material used for semiconductor devices and particularly a bonding material for bonding semiconductor elements which require heat dissipation, such as power semiconductors (such as power diodes) or semiconductor chips having fine internal wiring to substrates. This invention also relates to a semiconductor device having a semiconductor element bonded to a substrate with such a bonding material.

BACKGROUND ART

Typical examples of semiconductor devices are semiconductor devices in which a semiconductor chip (a silicon chip) is mounted on a frame, i.e., a substrate made of Cu or 42 alloy. Wire bonding using Au wires is carried out between a silicon chip and a frame. Bonding of a frame to a silicon chip sometimes uses an electrically conductive epoxy adhesive, but it is typical to use bonding by solder, which has high thermal conductivity and a large heat dissipating effect. This type of bonding is also referred to as internal bonding of semiconductor devices.

At the time of assembly of electronic equipment, semiconductor devices are mounted on printed circuit boards, and at this time they are subjected to heating by a second occurrence of reflow soldering. At this time, it is necessary that the soldered portions which previously underwent internal bonding not melt at the reflow temperature. Therefore, solder used for internal bonding of semiconductor devices employs solder alloys having a higher melting temperature than solder used for mounting on printed circuit boards. Such semiconductor devices themselves constitute semiconductor devices, but the semiconductor devices are further connected to circuit boards and constitute larger semiconductor devices. In this specification, solder which is used to carry out soldering of internal bonding of such semiconductor devices is referred to as high temperature solder.

In the past, high temperature solder was a Pb-based solder alloy having a melting temperature of around 300° C.

High temperature solders used for internal bonding of semiconductor devices include Pb-10Sn (solidus temperature of 268° C. and liquidus temperature of 302° C.), Pb-5Sn (solidus temperature of 307° C. and liquidus temperature of 313° C.), Pb-2Ag-8Sn (solidus temperature of 275° C. and liquidus temperature of 346° C.), and Pb-5Ag (solidus temperature of 304° C. and liquidus temperature of 365° C.) which primarily have Pb as a main component. These high temperature solders each have a solidus temperature of at least 260° C. Therefore, when using a 63Sn-37Pb eutectic solder, for example, for soldering for mounting on a printed circuit board, even if the soldering temperature at that time is a somewhat high level of 230° C., soldered portions for internal bonding of semiconductor devices which were soldered using a high temperature solder such as Pb-10Sn do not melt at the time of soldering for mounting on a printed circuit board.

However, from the standpoint of environmental protection, recently, over the entirety of soldering technology, there is a demand for the use of lead-free solder alloys in place of Pb-based solder alloys.

Naturally, there is also a demand to use lead-free solder alloys instead of Pb—Sn based high temperature solders like those described above which have been used for internal bonding of conventional semiconductor devices.

However, although there have been various proposals of lead-free solder alloys, there has been no high temperature solder alloy having Sn as a main component and having a solidus temperature of at least 260° C. For example, in the case of an Sn—Ag based solder alloy having a solidus temperature (eutectic point) of 221° C., increasing the Ag content increases the liquidus temperature but does not increase the solidus temperature. With an Sn—Sb based solder alloy having a solidus temperature of 227° C., when Sb is increased as much as possible in order to increase the solidus temperature, the liquidus temperature also greatly increases. The addition of other elements can also not change these properties.

Accordingly, from in the past, it has been thought impossible to use lead-free solder alloys as high temperature solders for internal bonding of semiconductor devices.

A bonding technique not using the high temperature solder alloys has been considered, i.e., a method of bonding using intermetallic compounds which have a high melting point compared to lead-free Sn-based solders.

Patent Document 1 discloses a method using a solder paste formed by mixing a powder of Sn or a powder of a lead-free solder having Sn as a main component with Cu powder. At the time of bonding by melting, bonding is carried out by forming an Sn—Cu intermetallic compound.

Patent Document 2 discloses one form of the invention described in Patent Document 1 as a solder material in which Sn powder or a lead-free solder powder having Sn as a main component and Cu powder undergo rolling to form a solder foil.

PRIOR ART DOCUMENTS

Patent Documents

Patent Document 1: JP 2002-254194 A
Patent Document 2: JP 2002-301588 A

SUMMARY OF THE INVENTION

Problem which the Invention is to Solve

As stated above, a bonding material used for internal bonding of semiconductor devices and internal bonds obtained thereby need a higher melting temperature than solder alloys used for mounting on printed circuit boards, but there are not yet any high temperature solder alloys having Sn as a main component with a solidus temperature of at least 260° C.

Reference Document 1 proposes a solder paste in which a powder of Sn or a lead-free solder having Sn as a main component is mixed with Cu powder, but the flux of the solder paste always contains a solvent, so if it is used in the form of a solder paste, the solvent in the flux evaporates at the time of heating and there is a tendency for voids to easily form. These voids become a cause of a decrease in reliability particularly in semiconductor devices having fine wiring.

The rolled powder material of Patent Document 2 can solve the problem of voids occurring due to evaporation of solvent. However, powder has a large surface area and easily oxidizes, so at the time of manufacture of Sn or Cu powder, an oxide film is already formed on the powder surface, so even if rolling of solder is carried out in an inert atmosphere as in Patent Document 2, oxides cannot be removed from the powder surface. In addition, if powder is simply rolled, gaps are never completely filled with solder, and voids easily form.

In Patent Document 2, even if soldering is carried out without using flux in a reducing atmosphere of hydrogen or the like, oxides which form on the powder surface before rolling of solder penetrate into the interior of the solder foil, and it is not possible to remove oxides in the interior of the solder foil in a reducing atmosphere of hydrogen or the like, so there is the problem that solder wettability defects develop and voids easily form.

The problem to be solved by the present invention is to provide a bonding material for internal bonding of semiconductor devices which does not use a flux, which has excellent wettability, and which does not develop voids.

Another object of the present invention is to provide a semiconductor device having internal bonds which do not melt at the time of mounting on a printed circuit board.

Means for Solving the Problem

The present inventors noticed that a composite material generally has excellent high temperature properties, and they perceived of carrying out internal bonding using a composite material, and as a result of further investigations, they found that a solder bonding material formed by using a porous metal sheet having a mesh-like structure as a base material for a composite material and impregnating it with a solder alloy and particularly a lead-free solder alloy to form a composite material is particularly effective for internal bonding of semiconductor devices and they completed the present invention.

Accordingly, in its broadest sense, the present invention is a solder bonding material for internal bonding of semiconductor devices formed by filling a porous metal body having a mesh-like structure with Sn or an Sn-based lead-free solder in a molten state and solidifying it. It is also a semiconductor device using the solder bonding material.

A "porous metal body having a mesh-like structure" which is used as a base material for a composite material means a "porous metal body having a porous structure, pores which make up the porous structure are connected in the form of a mesh, and at least a portion of the connecting pores are exposed on the surface of the metal body". In general, the porous metal body is in the form of a sheet. A porous metal body used in the present invention has electrical and thermal conductivity.

At present, porous metals are beginning to be made with the object of decreasing the weight of conventional bulk metals by making them porous and providing a filtering effect. It has been proposed to apply them to electrically conductive materials. The higher the frequency of electricity, the more it passes through the surface of a conductor, so a porous metal which has a large surface area compared to a bulk metal has a lower current per unit surface area with the same current, so it exhibits a decrease in electrical resistance and an effect of preventing electric power loss, and it is used for that purpose. In the present invention, this type of commercially available porous metal can be used as a starting material.

Effects of the Invention

With the present invention, internal bonding of semiconductor devices using a novel bonding material becomes possible, and internal bonding of semiconductor devices can be carried out without using lead.

In addition, according to the present invention, compared to a bonding material which uses a solder powder and forms intermetallic compounds, it is possible to obtain internal bonds of high reliability with few voids.

In addition, according to the present invention, since a porous metal body has a large surface area, when the porous metal body is previously impregnated with Sn or an Sn-based lead-free solder, the metals which constitute the porous metal body and Sn have increased adhesion at their boundaries and have greatly improved electrical conductivity and thermal conductivity. Moreover, even if the heating temperature at the time of internal bonding is decreased or the heating time is shortened, a sufficient amount of intermetallic compounds between Sn in the solder alloy and metals in the portion being bonded (Ni, Cu, and the like) are formed and guaranteed, so the melting temperature of joints increases, and an increase in the melting temperature of internal bonds when mounting semiconductor devices can be achieved.

EMBODIMENTS OF THE INVENTION

Figure 1:
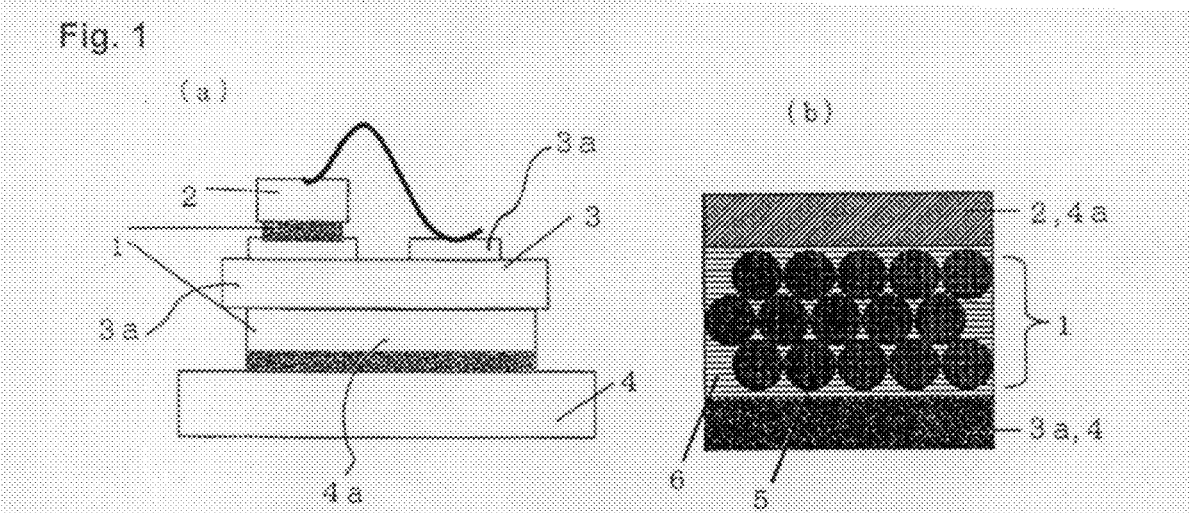
FIGS. 1(a) and 1(b) are respectively schematic explanatory views of the internal structure of a semiconductor device using a bonding material according to the present invention and of the bonding material.

FIG. 1(a) is a schematic explanatory view of a semiconductor device according to the present invention. A bonding material 1 according to the present invention performs internal bonding between a silicon chip (an IC chip) 2 and an Ni/Au plating layer 3a provided atop an insulating substrate 3. This assembly undergoes internal bonding of an insulating substrate 3 to a Cu-based substrate 4 through an Ni/Au plating layer 4a provided on the rear surface of the insulating substrate 3 to form the semiconductor device.

Bonding of the IC chip 2 and the Ni/Au plating layer 3a utilizes the good thermal conductivity of a bonding material according to the present invention. Bonding of the insulating substrate 3 to the Cu-based substrate 4 provides electrical connection to electrodes or connecting terminals and for heat dissipation. A bonding material according to the present invention can be used for either heat dissipation or electrical conduction.

The above-described assembly of the IC chip 2 which is internally bonded to the insulating substrate 3 is by itself sometimes referred to as a semiconductor device.

A semiconductor device which is internally bonded in this manner is mounted on a printed wiring board or the like to constitute electronic equipment such as a power supply.

FIG. 1(b) is an enlarged schematic view of an internal bond when the IC chip 2 and Ni/Au plating layer 3a or Ni/Au plating layer 4a and a Cu-based substrate 4 are bonded to each other using the bonding material 1. Normally, Ni/Au plating layer 3a and Ni/Au plating layer 4a are provided on the insulating substrate 3. The bonding material 1, which comprises a porous metal body 5 and an intermetallic compound 6, has a high melting point after heating and bonding. Prior to bonding, the interior of the porous metal body is filled with Sn or an Sn-based solder. As a result of heating at the time of bonding, an intermetallic compound of Sn is formed, and Sn which is present in elemental form is consumed. Therefore, the melting temperature increases.

A semiconductor device according to the present invention has a structure such that heat which is generated by the silicon chip is rapidly dissipated in the Cu-based substrate. The semiconductor device is used for parts such as fine wiring patterns of semiconductors and power semiconductors, which easily generate heat when they conduct electricity. In such applications, the bonds between the IC chip and the insulating substrate and between the insulating substrate and the Cu-based substrate easily reach a high temperature. In the past, a high temperature solder was used for bonding.

Instead of bonding with high temperature solder, according to the present invention, bonding is carried out by intermetallic compounds of Sn, and the bonded portions have a structure in which the body is constituted by a porous, mesh-like metal body.

As stated above, a bonding material according to the present invention is manufactured by filling connecting pores of a porous, mesh-like metal body with molten Sn or a molten Sn lead-free solder.

There are no particular limitations on a semiconductor device according to the present invention as long as internal bonding can take place, but a concrete example is a power semiconductor device.

Bonding Mechanism According to the Present Invention

According to the present invention, an intermetallic compound of Sn is formed in the bonding portion between a semiconductor element and a substrate constituting a semiconductor device. More specifically, a bonding portion is formed by a reaction between Sn or an Sn-based lead-free solder which is melted and fills a porous metal body and the metal constituting the porous metal body, and by a reaction between the lead-free solder and a Cu or Ni plating layer provided on the bonding surface. These reactions respectively occur when impregnating the porous metal body with the molten solder alloy and when carrying out internal bonding.

At the time of bonding of the semiconductor element and the substrate, these bonding surfaces and the metal surfaces of a Cu-10Sn alloy, for example, which constitutes the matrix of the porous metal body oppose each other through the lead-free solder alloy layer which fills the pores. If heating takes place in such a state of contact, the opposing bonding surfaces are wet by solder, and an intermetallic compound is formed by a reaction with Sn.

A bonding material according to the present invention forms an extremely thin intermetallic compound layer in the border between the porous metal body and the Sn or Sn-based lead-free solder alloy which fills it in a molten state, and substantially no surface oxide film is present. Therefore, a highly reliable internal bond having few voids is formed, and an intermetallic compound-forming reaction easily takes place due to heating at the time of bonding. As a result of promoting the formation of intermetallic compounds with Sn, substantially no Sn remains in elemental form.

It is necessary to rapidly carry out a compound-forming reaction in bonding using intermetallic compounds of Sn. In the past, Sn-based solder and Cu were used as powders, as in Patent Documents 1 and 2, and by increasing the surface area of Sn and Cu, a reaction which formed intermetallic compounds of Sn and Cu was promoted. However, if a fine powder is used in order to increase reactivity at that time, the powder of Sn and Cu easily oxidizes, and there was the problem that voids ended up increasing.

The present invention solves such problems. In the present invention, instead of fine Sn and Cu powder, a bonding material comprising a porous metal body having a mesh-like structure and Sn or an Sn-based lead-free solder alloy which melts and fills the porous metal body is used.

Porous Metal Body

A porous metal body used in the present invention can be a commercially available material. If necessary, a commercial product can be rolled to a prescribed thickness to adjust its porosity.

The porous metal body can be manufactured by methods such as the plating method in which expanded urethane undergoes electrical conductivity treatment, plating is carried out, and then the urethane is removed by heating, the slurry foam method in which a metal powder slurry containing expanded urethane directly undergoes foaming and then grease removal sintering is carried out, and the slurry coating method in which a metal powder slurry is applied to expanded urethane, it is sintered, and the urethane is removed.

According to the present invention, the metal of a porous metal body having a mesh-like structure can be any metal which can form an intermetallic compound by a reaction with Sn, such as Cu, Ag, Ni, and Cu alloys such as bronze. Table 1 shows intermetallic compounds which are formed by reactions between Sn and various metals. Cu and Cu alloys which easily react with Sn are particularly preferred.

Examples of pure copper and Cu alloys having a Cu content of at least 90% are copper materials such as deoxidized copper, touch pitch copper, phosphorus deoxidized copper, copper used for casting such as CAC101, CAC102, and CAC103, and copper alloys such as bronze in which Sn, Zn, or the like is added to Cu. If the Cu content of a Cu alloy used in a porous metal having a mesh-like structure is less than 90%, it interferes with an intermetallic compound-forming reaction with Sn or an Sn-based lead-free solder which fills the porous metal, which is not desirable. Pure copper and Cu alloys having a Cu content of at least 90% are preferred.

TABLE 1

| Metal | Filling solder | Intermetallic compounds formed | | |
| --- | --- | --- | --- | --- |
| Cu | 100% Sn | $Cu_6Sn_5$ | $Cu_3Sn$ | |
| Cu | Sn3Ag | $Cu_6Sn_5$ | $Cu_3Sn$ | $Ag_3Sn$ |
| Cu | Sn0.7Cu | $Cu_6Sn_5$ | $Cu_3Sn$ | |
| Cu | Sn3Ag0.5Cu | $Cu_6Sn_5$ | $Cu_3Sn$ | $Ag_3Sn$ |
| Ni | 100% Sn | $Ni_3Sn_4$ | | |
| Ag | 100% Sn | $Ag_3Sn$ | | |
| Cu10Sn | 100% Sn | $Cu_6Sn_5$ | $Cu_3Sn$ | |

Impregnation Method

In the present invention, because a porous metal body has a mesh-like structure with a pore structure which connects to the surface of the porous body, it is possible to impregnate solder to the interior of the pore structure just by immersing the porous metal body in a molten solder bath. Molten solder can be more efficiently impregnated to the interior if such impregnation treatment is carried out in a vacuum.

In the case of an elongated material such as a hoop material, the interior of the pores can be impregnated with molten solder by continuous immersion in a molten solder bath preferably in an inert gas atmosphere or a vacuum and then lifting the material out of the bath. By adjusting the rate of travel of the elongated material, the adhered weight of molten solder to the surface of the porous metal body, namely, the thickness of the bonding material can be adjusted. The entire surface of the porous metal body is thinly covered by the solder alloy. Of course, intermetallic compounds are formed in the interface between the molten solder alloy and the surface of the porous metal body at this time, whereby the bonding strength, namely, the adhesive strength between the two is increased.

There are no particular limitations on the solder alloy which is used for impregnation as long as it is lead free. However, in this type of application, elemental Sn, an Sn—Ag solder alloy, and an Sn—Ag—Cu solder alloy are preferred.

The amount of a solder alloy which is used in the present invention is an amount which can at least fill the pores of the porous metal body, and which can coat the surface such as one or both surfaces in the case of a plate-shaped porous metal body. The proportion of the solder alloy with respect to the porous metal body is preferably 20-30 area percent.

Thickness and Porosity of the Porous Metal Body

A bonding material according to the present invention is constituted by a thin plate. At the time of use, it is cut to a prescribed shape and used in the same manner as a so-called solder preform. Namely, a bonding material according to the present invention is disposed between the bonding surfaces of a semiconductor element and a substrate, for example, and bonding is carried out by heating the assembly in a reflow furnace. Therefore, the thickness of the porous metal body of a bonding material according to the present invention is preferably at least 0.1 mm and at most 0.2 mm. The porosity of a porous metal body having a mesh-like structure which is used in the present invention, namely, the porosity of the solder alloy is preferably in the range of 20-30 area percent.

In the present invention, when a porous metal body made of Cu or a Cu alloy and having a mesh-like structure with a porosity is 20-30% (expressed as a proportion of area) is impregnated with Sn or an Sn-based lead-free solder, Sn is consumed by the formation of $Cu_3Sn$ and $Cu_6Sn_5$ and the melting point of the bonding portion increases. If the porosity exceeds 30%, Sn remains in a low melting phase, and an increase in temperature is not realized. A porosity of 20-30 area percent is preferable from the standpoint of consuming an Sn phase, namely, an Sn solid solution phase and from improving bonding properties to prevent formation of voids and the like so that the melting temperature of the bonded portion increases.

As stated above, a porous metal body used in the present invention can be a commercial product. However, commercial products often have a thickness of around 1-0.5 mm, and their porosity is around 60%. Therefore, when using such a commercial product, it is preferable to adjust the product to a desired thickness and porosity before carrying out impregnation with molten solder according to the present invention. Such adjustment can be carried out by rolling.

There is no particular limit on the total thickness of the porous metal body and the solder layer of a solder bonding material according to the present invention, and it can be made a suitable thickness as needed. In general, however, it is around 0.1-0.5 mm. Preferably it is 0.15-0.3 mm. A solder layer may be adhered to just one side, but normally both sides are covered with a solder layer.

In order to carry out internal bonding of a semiconductor device using a solder bonding material according to the present invention, a semiconductor element and an insulating substrate or an insulating substrate and a base substrate, for example, are superposed with a solder bonding material between them, and this laminated assembly is heated to carry out fluxless bonding. There are no particular limitations on the heating conditions at this time. As one example, heating is carried out for at least 5 minutes in an atmosphere selected from an inert gas atmosphere, a reducing gas atmosphere, and a reduced pressure atmosphere at 300-350° C.

Next, the present invention will be more concretely explained by examples.

EXAMPLE 1

Phosphorus bronze powder (product name, P-201) manufactured by Fukuda Metal Foil and Powder Company, Ltd. was sintered at 880° C. in a reducing atmosphere to prepare a porous metal body (length of 1 meter, width of 15 mm, thickness of 0.1 mm, porosity of 25%), and it was immersed in various solder baths at 250-260° C. to impregnate its pores with lead-free solder. Flux was not used for impregnation with the molten solder. Instead, an oxide film was removed from the porous metal body by impinging ultrasonic waves in the solder bath, and the formation of voids was prevented. The pore structure of the porous body which was used had continuous pores connected in a mesh-like manner, and the pores opened onto the surface of the plate.

The thickness of the bonding material, namely, the thickness of the metal body plus the adhered amount of solder was controlled by the speed of removal of the porous metal body from the solder bath. It was adjusted so that the total thickness of the solder alloy layer and the porous metal body was 0.15-0.2 mm. The thickness of the solder alloy layer was 0.05-0.1 mm.

The resulting bonding material was punched in a press to a size of 3 mm×3 mm. Using the punched bonding material, an assembly was formed by mounting a silicon chip atop a Cu plate through the bonding material. The resulting assembly was held under conditions simulating reflow, then it was cooled, the cross section of the bonding portion was observed with a microscope, and the bonding strength was measured.

Bonding was carried out to a Cu plate because a frame is formed from a Cu alloy plate which is plated with Ni. Therefore, a Cu plate simulated a frame.

Figure 2:
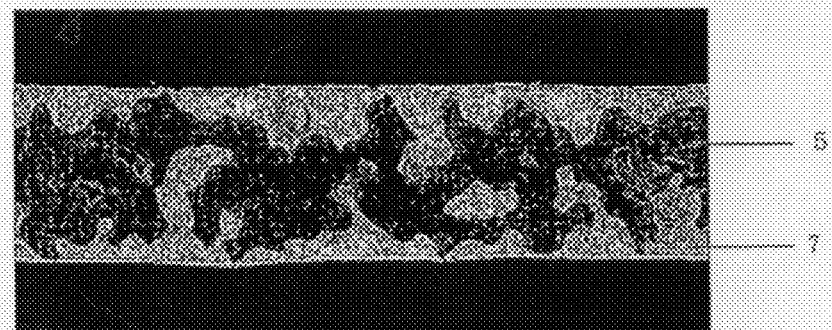
FIG. 2 is a cross-sectional view taken with a microscope of the structure of a bonding material in a first example of the present invention in which molten Sn fills a porous metal.

FIG. 2 is a photomicrograph of the structure of the cross section of a bonding material used in Example 1 of Table 2 (magnification of 500×).

It can be seen that the porous metal body 5 was surrounded by a solder alloy 7 which melted and impregnated the porous metal body. The presence of $Cu_6Sn_5$ intermetallic compounds and $Cu_3Sn$ intermetallic compounds between the two was ascertained. However, it was ascertained that a solder alloy was present particularly in the surface portion.

Figure 3:
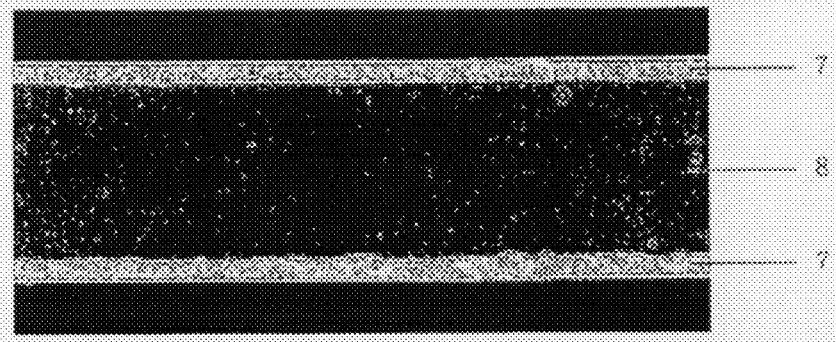
FIG. 3 is a cross-sectional view taken with a microscope of the structure of a bonding material in Comparative Example 1 in which a Cu sheet is soldered with Sn.

FIG. 3 is a photomicrograph (magnification of 500×) of a cross section showing the structure of a bonding material which does not have a pore structure (porosity of 0%) used in Comparative Example 1 of Table 2. It can be seen that a bulk metal body 8 (made of Cu) and a solder layer 7 (made of Sn) were cleanly laminated on each other.

Figure 4:
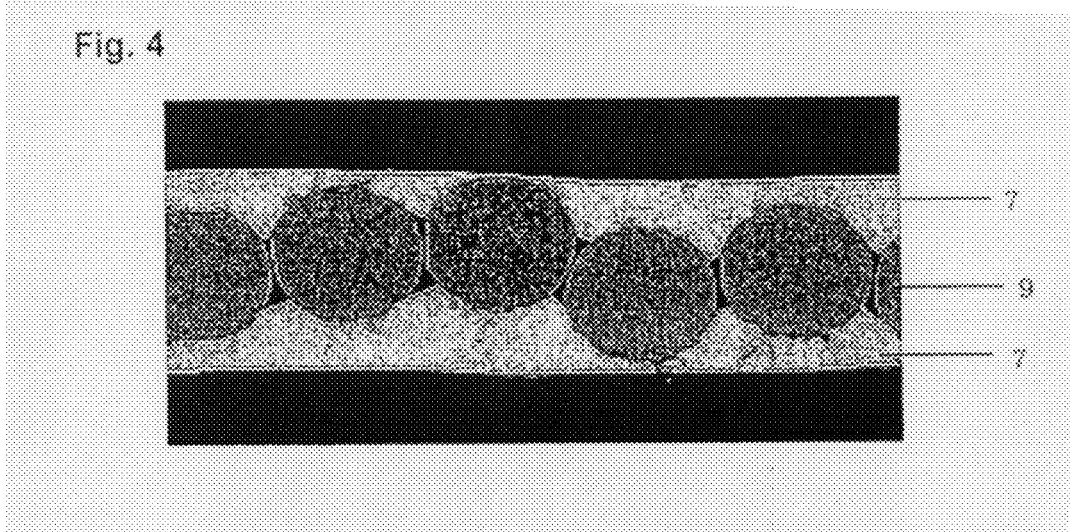
FIG. 4 is a cross-sectional view taken with a microscope of the structure of a bonding material in Comparative Example 7 in which a porous metal having a high porosity is filled with molten Sn.

FIG. 4 is photomicrograph of the structure of a cross section of a bonding material having a porosity of at least 35% used in Comparative Example 4 in Table 2 (magnification of 500×). The porous metal body 9 had a high porosity, so the amount of solder (Sn) 7 which filled it increased to that extent, and when a bonding portion was finally formed, Sn which was the solder component was present in elemental form. As a result, a decrease in the melting temperature could not be avoided.

TABLE 2

|  |  | Filling solder | Porous metal | Voids percentage (%) | Plating material (electrode side/substrate side) | Formation of IMC (μm²) | Voids (%) | Bonding strength at 260° C. (N) | Melting temperature (° C.) | Evaluation |
|---|---|---|---|---|---|---|---|---|---|---|
| Examples | 1 | Sn100 | Cu | 19.16 | Ni/Ni | 11747 | 18.6 | 29.3 | At least 260 | ○ |
|  | 2 | Sn100 | Cu10Sn | 21.33 | Cu/Cu | 11157 | 18.9 | 41.4 | At least 260 | ○ |
|  | 3 | Sn3Ag0.5Cu | Cu10Sn | 25.15 | Ni/Ni | 13033 | 16.9 | 34.8 | At least 260 | ○ |
|  | 4 | Sn3Ag0.5Cu | Cu | 27.29 | Cu/Cu | 11261 | 5.0 | 55.0 | At least 260 | ○ |
|  | 5 | Sn100 | Cu | 28.67 | Ni/Ni | 11679 | 19.8 | 46.0 | At least 260 | ○ |
|  | 6 | Sn3Ag0.5Cu | Cu10Sn | 30.62 | Ni/Ni | 15260 | 16.9 | 53.1 | At least 260 | ○ |
| Comparative Examples | 1 | Sn100 | Cu | 0.00 | Cu/Cu | 5558 | 46.9 | 0.0 | 227 | X |
|  | 2 | Sn3Ag0.5Cu | Cu10Sn | 8.14 | Cu/Cu | 6292 | 26.8 | 4.8 | 217 | X |
|  | 3 | Sn100 | Cu10Sn | 38.82 | Cu/Cu | 8588 | 42.3 | 11.9 | 227 | X |
|  | 4 | Sn100 | Cu | 45.42 | Cu/Cu | 7954 | 54.5 | 0.0 | 217 | X |

Note:
The numbers in the columns for "filling solder" and "porous metal" indicate the proportion of the composition [mass %]

The porosity shown in Table 2 was measured by sensing the pores in an image of a cross section of the porous body. Accordingly, the porosity is indicated by an area percent. The image analysis software used for detection was "Scandium" manufactured by Soft Imaging System. Because the metal portion and the pores have a different contrast in an image, it is possible to distinguish them by image analysis, and measurement was carried out by detecting only the pores.

EXAMPLE 2

A bonding material measuring 5 mm×5 mm was punched from the bonding material manufactured in Example 1, it was bonded to a Cu plate or an Ni-plated Cu plate measuring 10 mm×10 mm, an Sn—Cu intermetallic compound was formed to simulate a bonding portion.

A model IrF-TP high temperature observation apparatus manufactured by Yonekura Seisakusho Co., Ltd. was used for bonding, and heating was carried out with a heating temperature of 350° C. for 15 minutes.

The amount of intermetallic compounds (IMC) which were formed in the bonding portion which was obtained in this manner was measured. The measurement method used a model JSM-7000F scanning electron microscope manufactured by JEOL Ltd., the region where compounds were present was sensed from the cross section of the bonding portion, the detected area was measured, and made the amount of compounds which were formed (μm²). The results are shown in Table 2.

In the same manner, the voids percentage of the bonding portion was measured. The measurement method used a TOSMICRON x-ray transmission apparatus manufactured by Toshiba Corporation, the voids were detected, and the percentage of voids with respect to the area of the overall bonding portion was determined.

The results are shown in Table 2.

The bonding strength and the melting temperature of a bonding material according to the present invention manufactured in Example 1 were measured.

The method of measuring the bonding strength was based on JIS Z 3198-5. A bonding material according to the present invention (measuring 3 mm×3 mm) was placed atop a Cu plate measuring 30 mm on a side, a Cu chip measuring 3 mm×3 mm and having a thickness of 1 mm was placed atop it as a measurement specimen, and they were bonded to each other by heating.

Measurement was carried out using a model STR-1000 joint strength tester manufactured by Rheska Corporation and was carried out at a shear speed of 6 mm per minute at a test temperature from room temperature to 250° C.

The method of measuring the melting temperature was based on JIS Z 3198-1. The thermal analysis was carried out using a model DSC6200 differential scanning calorimeter manufactured by Seiko Instruments Inc., the rate of temperature increase was 5° C. per minute, and the melting point was ascertained after heating for bonding in the range of 180-280° C. The bonding test material was the same as that used for the strength test.

The results are shown in Table 2.

EXAMPLE 3

Using the bonding material manufactured in Example 1 (see Example 1 in Table 2), a silicon chip was bonded to an insulating plate, and a Cu substrate was bonded thereto to form a semiconductor device as shown in FIG. 1. Next, the semiconductor device was mounted on a printed circuit board at a reflow temperature of 240° C.

The internal bonds of the semiconductor device did not melt at the time of mounting.

EXPLANATION OF SYMBOLS 1 bonding material
2 IC chip
3 insulating substrate
4 base substrate
5 porous metal body
6 intermetallic compound
7 lead-free solder
8 bulk metal body (porosity of 0%)
9 porous metal body (porosity of at least 35%)

The invention claimed is:
1. A solder bonding material comprising:
an electrically conductive porous metal body having a mesh-like structure with pores, and
Sn or an Sn-based lead-free solder alloy which impregnates the pores of the porous metal body and covers a surface of the porous metal body, the porous metal body having a porosity expressed as a proportion of the cross-sectional area of the pores with respect to a cross-sectional area of the porous metal body of 20-30%,
wherein in a state before the solder bonding material is heated to bond the solder bonding material to another member, the Sn or the Sn-based lead-free solder alloy is bonded to the porous metal body by an intermetallic compound layer.

2. A solder bonding material as claimed in claim 1 wherein the porous metal body is made of at least one material which is selected from Cu, Ni, Ag, and Cu alloys having a Cu content of at least 90 mass % and which forms an intermetallic compound by a reaction with Sn.

3. A solder bonding material as claimed in claim 1 wherein the 20-30% by area of the porous metal body is occupied by the Sn or Sn-based lead-free solder alloy.

4. A solder bonding material as claimed in claim 1 wherein the thickness of the porous metal body is at least 0.1 mm and at most 0.2 mm and the overall thickness of the solder bonding material including the Sn or Sn-based lead-free solder alloy is 0.15-0.3 mm.

5. A method of manufacturing a solder bonding material as claimed in claim 1 comprising immersing a porous metal body having a pore structure which communicates from an interior to a surface of the porous metal body in a molten bath of molten Sn or a molten Sn-based lead-free solder alloy to impregnate the interior of the pore structure of the porous metal body and coat the surface of the porous metal body with the molten Sn or the molten Sn-based lead-free solder alloy, removing the porous metal body from the molten bath, and solidifying the molten Sn or Sn-based lead-free solder alloy which impregnates the pore structure of the porous metal body and coats the porous metal body.

6. A semiconductor device comprising an insulating substrate and a semiconductor element which is bonded to the insulating substrate by a solder bond formed by the solder bonding material as claimed in claim 1.

7. A semiconductor device as claimed in claim 6 wherein an elemental Sn phase is consumed in the solder bond.

8. A semiconductor device as claimed in claim 6 wherein the solder bond does not melt at 260° C.

9. A solder bonding material as claimed in claim 1 wherein the porous metal body is a porous sintered body.

10. A solder bonding material as claimed in claim 1 wherein the porous metal body is formed by a method selected from (a) plating expanded urethane and removing the urethane by heating, (b) foaming a metal powder slurry containing expanded urethane and then performing grease removal sintering, and (c) applying a metal powder slurry to expanded urethane and performing sintering to remove the urethane.

11. A method of performing internal bonding of a semiconductor device comprising performing fluxless bonding of a semiconductor element to an insulating substrate using a solder bonding material as claimed in claim 1 by heating in an atmosphere selected from an inert gas atmosphere, a reducing gas atmosphere, and a reduced pressure atmosphere for at least 5 minutes at a temperature of 300°-350° C.

* * * * *